(12) United States Patent
Stojakovic et al.

(10) Patent No.: US 12,136,913 B2
(45) Date of Patent: Nov. 5, 2024

(54) SOLID-STATE MULTI-CHANNEL PROTECTION CIRCUIT

(71) Applicant: Aptiv Technologies AG, Schaffhausen (CH)

(72) Inventors: Nikola Stojakovic, Windsor (CA); John Caputo, Canfield, OH (US)

(73) Assignee: APTIV TECHNOLOGIES AG, Schaffhausen (CH)

( * ) Notice: Subject to any disclaimer, the term of this patent is extended or adjusted under 35 U.S.C. 154(b) by 129 days.

(21) Appl. No.: 17/841,785

(22) Filed: Jun. 16, 2022

(65) Prior Publication Data

US 2022/0407410 A1    Dec. 22, 2022

Related U.S. Application Data

(60) Provisional application No. 63/212,142, filed on Jun. 18, 2021.

(51) Int. Cl.

| | | |
|---|---|---|
| *H03K 17/082* | (2006.01) | |
| *H02H 1/00* | (2006.01) | |
| *H02H 7/20* | (2006.01) | |
| *H03K 17/042* | (2006.01) | |
| *H02M 1/00* | (2006.01) | |
| *H02M 1/32* | (2007.01) | |
| *H03K 17/08* | (2006.01) | |

(52) U.S. Cl.
CPC ....... *H03K 17/0822* (2013.01); *H02H 1/0038* (2013.01); *H02H 7/20* (2013.01); *H03K 17/04213* (2013.01); *H02M 1/0009* (2021.05); *H02M 1/327* (2021.05); *H03K 2017/0806* (2013.01); *H03K 2217/0027* (2013.01)

(58) Field of Classification Search
CPC ......... H03K 2017/0806; H03K 17/042; H03K 17/04213; H03K 17/082; H03K 17/687; H03K 2217/0027
See application file for complete search history.

(56) References Cited

U.S. PATENT DOCUMENTS

| | | |
|---|---|---|
| 5,898,557 A | 4/1999 | Baba et al. |
| 2013/0063850 A1 | 3/2013 | Kawamoto et al. |
| 2016/0182039 A1* | 6/2016 | Xiao ...................... H03K 17/18 307/115 |
| 2018/0102774 A1 | 4/2018 | Leong et al. |
| 2021/0044288 A1 | 2/2021 | Troyer |

OTHER PUBLICATIONS

"Extended European Search Report Received Mailed on Nov. 15, 2022", 10 Pages.

* cited by examiner

*Primary Examiner* — Gary L Laxton
(74) *Attorney, Agent, or Firm* — Billion & Armitage

(57) ABSTRACT

A solid-state multi-channel protection circuit includes a microcontroller, a current sensor, a plurality of temperature sensors, and first and second multiplexers selectively connecting the current sensor to one of a plurality of solid-state devices and each of the plurality of temperature sensors to the microcontroller. The microcontroller selectively controls the second multiplexer to receive a temperature output associated with one of the plurality of solid-state devices, and selectively controls the first multiplexer to receiver a current output related to the measured current associated with the same solid-state device, wherein the microcontroller provide over-current protection and over-temperature protection based on the received temperature output and the received current output.

15 Claims, 2 Drawing Sheets

SOLID-STATE MULTI-CHANNEL PROTECTION CIRCUIT

CROSS-REFERENCE TO RELATED APPLICATIONS

This application claims the benefit of and priority to U.S. provisional application 63/212,142, titled "SOLID-STATE MULTI-CHANNEL PROTECTION CIRCUIT", filed Jun. 18, 2021, the contents of which are incorporated by reference herein.

FIELD

This disclosure is generally directed to electrical protection circuits and in particular to solid-state protection circuits.

BACKGROUND

In the automotive industry, as elsewhere, electrical systems have grown in complexity and prevalence. These systems increasingly rely on power semiconductor devices capable of being used in power applications. To provide the functionality required, "smart" power semiconductor devices are utilized such as "smart PETs", which include embedded components such as charge pumps, current and temperature sensing, and self-protection features utilized to protect against over-temperature, under-voltage, and over-current. While these devices are robust, one of the drawbacks is the limited current (A) carrying capacity of these devices. For example, in some automotive applications these Smart PET devices have a maximum current carrying capacity of 15A-18A before entering a self-protection mode. In addition, connecting the smart PETs in parallel with one another is not recommended and therefore cannot be utilized as a solution to the maximum current carrying capacity of the Smart PETs. Furthermore, additional components—such as charge pump, current and temperature sensors and self-protection features add to the cost associated with a Smart PET.

It would therefore be beneficial to develop power semiconductor devices capable of overcoming the drawbacks of traditional Smart PET devices while still providing the required robust performance (e.g., self-protection against over-temperature, under-voltage, and over-current.

SUMMARY

A solid-state multi-channel protection circuit includes a microcontroller, a current sensor, a plurality of temperature sensors, and first and second multiplexers selectively connecting the current sensor to one of a plurality of solid-state devices and each of the plurality of temperature sensors to the microcontroller. The microcontroller selectively controls the second multiplexer to receive a temperature output associated with one of the plurality of solid-state devices, and selectively controls the first multiplexer to receiver a current output related to the measured current associated with the same solid-state device, wherein the microcontroller provide over-current protection and over-temperature protection based on the received temperature output and the received current output.

According to another aspect, a solid-state multi-channel protection circuit includes a microcontroller, a voltage sensor, and a first multiplexer. The voltage sensor is configured to generate a voltage output related to a measured voltage to the microcontroller. A first multiplexer is configured to selectively connect the voltage sensor to one of a plurality of solid-state devices, wherein the voltage sensor generates the voltage output with respect to the selectively connected solid-state device. The microcontroller selectively controls the first multiplexer to receive a voltage output related to the measured voltage output associated with the same solid-state device, wherein the microcontroller provides under-voltage protection based on the received voltage output.

According to another aspect, a method of providing multi-channel circuit protection includes controlling a first multiplexer to select a temperature sensor associated with one of a plurality of solid-state devices and receiving at a microcontroller a temperature signal associated with the selected solid-state device. The method further includes controlling a second multiplexer to connect a current sensor to the selected solid-state device, wherein the current sensor generates a current output with respect to the selectively connected solid-state device. The microcontroller receives a current output associated with the selected solid-state device and provides over-current and over-temperature protection based on the received temperature signal and the received current output.

DETAILED DESCRIPTION

The present disclosure is directed to a solid-state multi-channel protection circuit that includes a plurality of solid-state devices (e.g., metal-oxide semiconductor field-effect transistor or MOSFETs) and circuit protection circuitry that is shared by the plurality of solid-state devices. A benefit of this configuration is standard solid-state devices (e.g., MOSFETs that do not include integrated circuit protection circuitry) may be connected in parallel with one another to increase the current-carrying capability and circuit protection circuitry may be shared by the plurality of solid-state devices.

Figure 1:
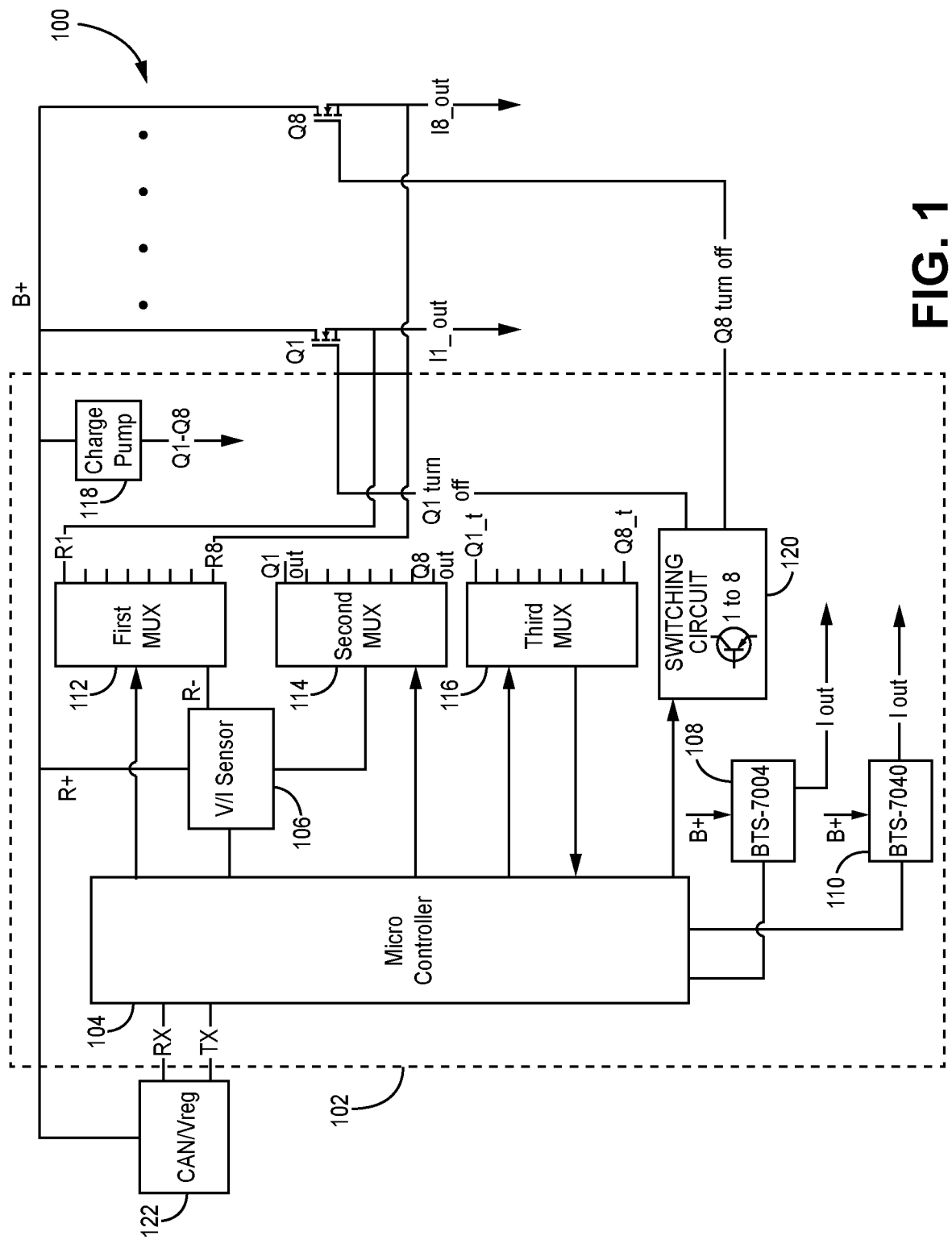
FIG. 1 is a circuit diagram of a solid-state multi-channel protection circuit according to some embodiments.

FIG. 1 is a circuit diagram of a solid-state multi-channel protection circuit 100 according to some embodiments. Solid-state multi-channel protection circuit 100 includes a plurality of solid-state devices Q1-Q8 (e.g., MOSFETs) and protection circuit 102 shared by the plurality of solid-state devices Q1-Q8 (only solid-state devices Q1 and Q8 are shown). In some embodiments, circuit protection circuitry 102 includes a microcontroller 104, voltage/current (V/I) sensor 106, BTS circuits 108 and 110, first multiplexer 112, second multiplexer 114, third multiplexer 116, charge pump 118, and switching circuit 120.

In some embodiments, charge pump 118 is shared across the plurality of solid-state devices Q1-Q8. In some embodiments, charge pump 118 is connected to the drain terminal of each of the plurality of solid-state devices (e.g., MOSFETs) Q1-Q8. In some embodiments, the plurality of high-side solid-state devices are driven by the charge pump 118, which is shared by the plurality of solid-state devices Q1-Q8. The plurality of solid-state devices Q1-Q8 are turned On/Off by switching circuit 120. In some embodiments, switching circuit 120 includes a plurality of individual transistors (e.g., bi-polar junction transistors or BJT), each transistor connected to the gate terminal of the plurality of solid-state devices Q1-Q8. The individual transistors associated with switching circuit 120 are utilized to selectively turn the solid-state devices Q1-Q8 On and Off.

In some embodiments, circuit protection circuitry 102 provides shared monitoring of the plurality of solid-state devices Q1-Q8. That is, rather that each solid-state device Q1-Q8 including dedicated current, voltage, and/or temperature monitoring, the functions provided by circuit protection circuitry 102 are shared across the plurality of solid-state devices Q1-Q8. For example, in some embodiments the circuit protection circuitry 102 includes a single current sensor (e.g., V/I sensor 106 selectively controlled by microcontroller 104 to operate in a current-monitoring mode or voltage-monitoring mode) that is shared across the plurality of solid-state devices Q1-Q8 via first multiplexer 112. In addition, the circuit protection circuit may include a single voltage sensor (e.g., V/I sensor 106 selectively controlled by the microcontroller 104 to operate in a voltage-monitoring mode) that is shared across the plurality of solid-state devices Q1-Q8 via the second multiplexer 114. In some embodiments, a third multiplexer 116 is configured to receive temperature inputs from a plurality of temperature sensors (not shown), each temperature sensor located in close proximity to one of the plurality of solid-state devices Q1-Q8. In this way, the microcontroller 104 provides over-current, under-voltage, and over-temperature protection for the plurality of standard solid-state devices Q1-Q8 without requiring that each individual solid-state device include dedicated circuit protection circuitry.

With respect to current sensing, microcontroller 104 selectively operates the V/I sensor 106 in the current-sensing mode, and selectively operates the first multiplexer 112 to connect the V/I sensor 106 across one of the plurality of solid-state devices Q1-Q8 (while operating the solid-state device Q1-Q8 in the ON mode). In some embodiments, the junction resistance of the selected solid-state device (e.g., RdsON) is utilized to calculate the current flowing through the selected solid-state device. The junction resistance of the solid-state devices may vary with temperature of the solid-state device. Microcontroller 104 monitors the temperature of each solid-state device via the third multiplexer 116. A lookup table stored by the microcontroller 104 is utilized to determine the junction resistance of each solid-state device Q1-Q8 based on the monitored temperature associated with each solid-state device. The determined junction resistance RdsON is then utilized in combination with voltage sensed by the V/I sensor 106 to determine the current flowing through one of the plurality of solid-state devices Q1-Q8. Based on the measured current, the microcontroller 104 provides overcurrent protection (i.e., selectively turning OFF selected solid-state devices Q1-Q8 in response to the current exceeding a threshold value). In some embodiments, the microcontroller sequentially monitors each of the plurality of solid-state device currents (and temperatures).

In other embodiments, a dedicated current sensor may be utilized that may be selectively connected to directly measure a current flowing through a selected solid-state device Q1-Q8. A benefit of utilizing a V/I sensor 106 configured to measure a voltage across the solid-state device Q1-Q8 is that the junction resistance of the solid-state device may be utilized to calculate a current flowing the device based on the measured voltage and no additional resistance or resistors are required. In addition, in some embodiments the sensor utilized to measure the voltage across the solid-state device (for current monitoring) may be utilized to provide under-voltage protection.

In some embodiments, the microcontroller 104 also provides under-voltage circuit protection for each of the plurality of solid-state devices Q1-Q8 using V/I sensor 106 (operated in a voltage monitoring mode) in combination with the second multiplexer 114. However, in some embodiments, a dedicated voltage monitoring circuit (separate from the current monitoring circuit) may be utilized in combination with the second multiplexer 114. The monitored output voltage associated with each of the plurality of solid-state devices Q1-Q8 is utilized to detect open load or shorts to the battery when the solid-state device is in the Off state. In some embodiments, an under-voltage condition is communicated to the system via CAN bus 122. In contrast with the monitoring for over-current conditions which requires the solid-state device to be On, under-voltage monitoring requires the solid-state device being monitored to be Off. In some embodiments, over-current detection and under-voltage detection may operate concurrently on different solid-state devices Q1-Q8 depending on the On/Off status of the respective solid-state switches Q1-Q8. Based on the measured voltage, the microcontroller 104 provides under-voltage circuit protection (i.e., selectively turning OFF selected solid-state devices Q1-Q8 in response to the voltage falling below a threshold value).

Figure 2:
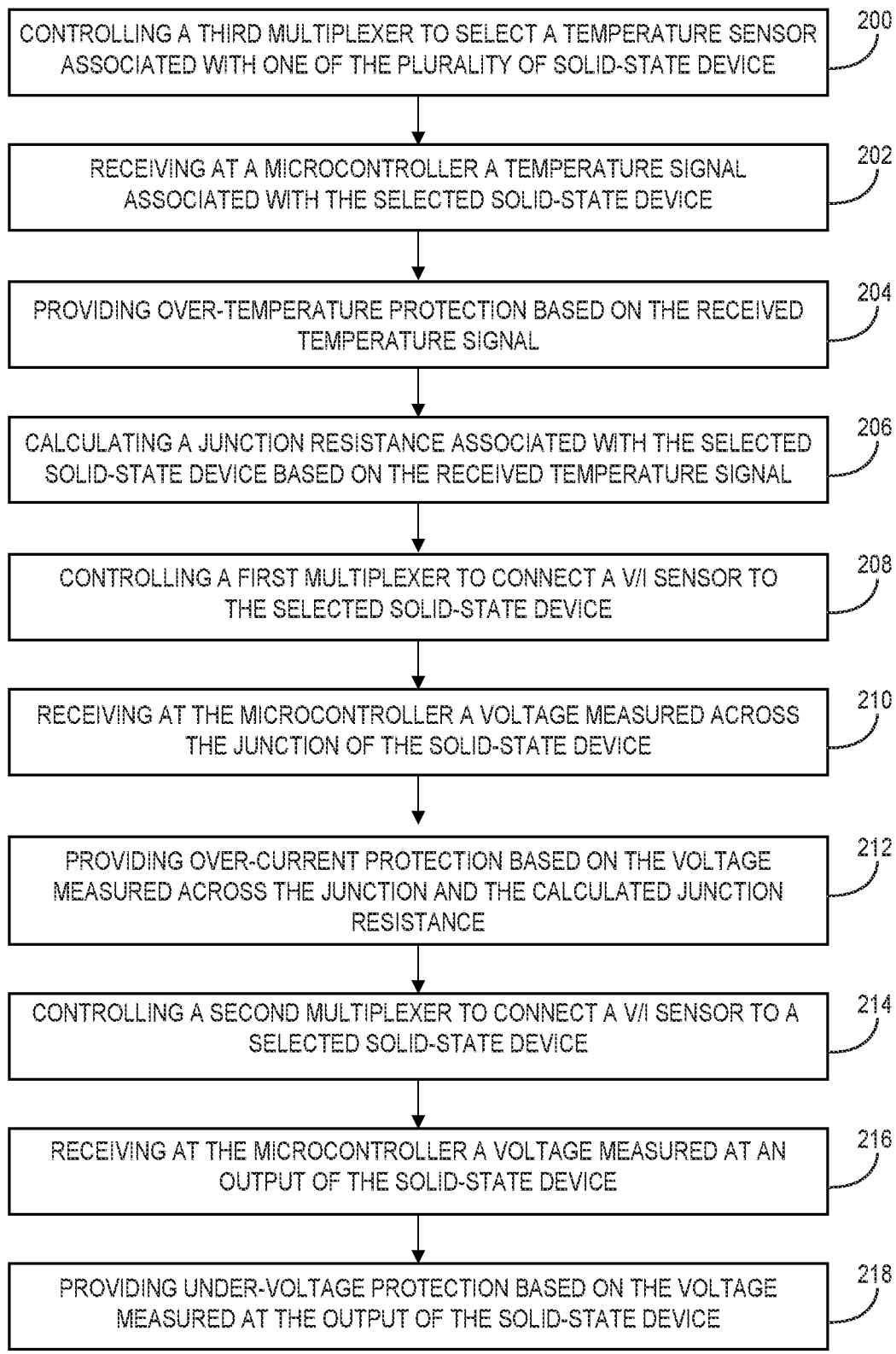
FIG. 2 is a flowchart that illustrates a method of operating a solid-state multi-channel protection circuit according to some embodiments.

FIG. 2 is a flowchart that illustrates a method of operating a solid-state multi-channel protection circuit according to some embodiments. Reference is made to the components shown in FIG. 1.

At step 200, the microcontroller 104 controls a third multiplexer 116 to select a temperature sensor associated with one of the plurality of solid-state devices. As described above, each of the plurality of temperature sensors is positioned close to each of the plurality of solid-state devices so that the measured temperature is representative of the temperature of the solid-state device Q1-Q8. At step 202, the microcontroller 104 receives via the third multiplexer 116 1a temperature signal associated with the selected solid-state device Q1-Q8. At step 204, the microcontroller 104 provides over-temperature protection based on the received temperature signal. For example, in some embodiments this may include comparing the received temperature signal to a threshold value. If the received temperature signal is greater than the threshold value, then the microcontroller may turn Off the solid-state device Q1-Q8 associated with the received temperature signal.

At step 206, the received temperature signal associated with one of the plurality of solid-state devices Q1-Q8 is utilized to calculate a junction resistance associated with the particular solid-state device Q1-Q8. In some embodiments, measuring the current associated with a solid-state device to provide over-current protection requires utilizing the junction resistance of the solid-state device in combination with the measured voltage across the solid-state device to calculate the current flowing through the device. The junction resistance is proportional to the temperature of the solid-state device, and therefore a determination of the temperature of the solid-state device may improve the accuracy of measured current. In some embodiments, the microcontroller 104 measures the temperature of a particular solid-state device Q1-Q8 prior to or immediately subsequent to measuring the current through a solid-state device Q1-Q8. In some embodiments, the microcontroller 104 includes a look-up table utilized to correlate a measured temperature with a junction resistance.

At step 208, the microcontroller 104 controls a first multiplexer 112 to connect a V/I sensor 106 to a selected solid-state device Q1-Q8. In some embodiments, overcurrent protection is only provided to solid-state devices Q1-Q8 that are On or conducting. In some embodiments, microcontroller will only control the first multiplexer 112 to connect the V/I sensor 106 to selected solid-state device Q1-Q8 that are currently in the On state. In some embodiments, microcontroller 104 communicates with switching circuit 120 to determine the On/Off status of the each of the plurality of solid-state devices Q1-Q8. In some embodiments, V/I sensor 106 is a current sensor configured to measure the current through the selected solid-state device Q1-Q8. In other embodiments, V/I sensor 106 is a voltage sensor configured to measure the voltage across the selected solid-state device Q1-Q8. As described above, one of the benefits of the multi-channel protection circuit shown in FIG. 1 is that a single V/I sensor 106 may be utilized to provide over-current and/or under-voltage protection monitoring of the plurality of solid-state devices Q1-Q8.

At step 210, assuming the V/I sensor 106 is a voltage sensor, the microcontroller 104 receives a voltage measured by the V/I sensor 106 across the junction of the selected solid-state device. Based on the junction resistance—calculated at step 206 based on the measured temperature of the solid-state device—and the voltage measure across the junction of the selected solid-state device, the current through the solid-state device is determined.

At step 212, the microcontroller 104 provides over-current protection based on the measured current flowing through the solid-state device. In some embodiments, this includes comparing the measured current to a threshold value. In the event the measured current is greater than the threshold value then the microcontroller 104 instructs the switching circuit 120 to turn Off the respective solid-state switch. In some embodiments, the microcontroller 104 requires the measured current to exceed a threshold value for a determined period of time. In some embodiments, the determined period of time is dependent on the magnitude of the measured current. For example, a measured current exceeding a threshold value by a large amount may require only a short period of time before tripping an over-current condition. Conversely, a measured current exceeding a threshold value by only a small amount may require a longer period of time to trip over-current protection.

At step 214, the microcontroller 104 controls a second multiplexer 114 to connect a V/I sensor 106 to measure an output voltage of one of the plurality of solid-state devices Q1-Q8. In some embodiments, the V/I sensor 106 is utilized both to measure the voltage across a selected solid-state device Q1-Q8 (for over-current protection) and to measure an output voltage associated with a selected solid-state device (for under-voltage protection). Over-current protection is provided when the selected solid-state device Q1-Q8 is On or conducting. Conversely, under-voltage protection is provided while the selected solid-state device Q1-Q8 is Off or non-conductive.

At step 216, the microcontroller 104 receives an voltage measured at the output of the selected solid-state device Q1-Q8 by the V/I sensor 106. At step 218, the microcontroller 104 compares the measured output voltage to a threshold value. If the measured voltage is less than the threshold value, this is indicative of an under-voltage condition (e.g., open load or short-circuit condition). In some embodiments, in response to a detected under-voltage condition, the microcontroller 104 communicates the detected condition to the system via CAN bus 122.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A solid-state multi-channel protection circuit comprising:
   a microcontroller;
   a current sensor configured to generate a current output related to a measured current to the microcontroller;
   a first multiplexer configured to selectively connect the current sensor to one of a plurality of solid-state devices, wherein the current sensor generates the current output with respect to the selectively connected solid-state device;
   a plurality of temperature sensors each configured to provide a temperature output related to measure temperature, each temperature sensor located proximate to one of the plurality of solid-state devices; and
   a second multiplexer configured to selectively provide the temperature output measured by each of the plurality of temperature sensors to the microcontroller;
   a voltage sensor configured to generate a voltage output related to measured voltage to the microcontroller; and
   a third multiplexer configured to selectively connect the voltage sensor to one of the plurality of solid-state devices, wherein voltage sensor generates the voltage output with respect to the selectively connected solid-state device;
   wherein the microcontroller selectively controls the second multiplexer to receive a temperature output associated with one of the plurality of solid-state devices, and selectively controls the first multiplexer to receiver a current output related to the measured current associated with the same solid-state device, and selectively controls the third multiplexer to receive a voltage output associated with one of the plurality of solid-state devices, wherein the microcontroller provide over-current protection, over-temperature protection, and under voltage protection based on the received temperature output, and the received current output, and the received voltage output, respectively.

2. The solid-state multi-channel protection circuit of claim 1, wherein the voltage sensor and the current sensor are integrated into a voltage/current sensor selectively controlled by the microcontroller to operate in a first mode to measure current and a second mode to measure voltage.

3. The solid-state multi-channel protection circuit of claim 2, wherein in the first mode the voltage/current sensor is selectively connected to measure a voltage across one of the plurality of solid-state devices.

4. The solid-state multi-channel protection circuit of claim 3, wherein the microcontroller includes a loop-up table that correlates measured temperature with junction resistance of the solid-state devices, wherein the junction resistance is utilized by the microcontroller to calculate current based on the measured voltage across one of the plurality of solid-state devices and the junction resistance correlated with measured temperature.

5. The solid-state multi-channel protection circuit of claim 2, wherein in the second mode the voltage/current sensor is selectively connected to measure an output voltage associated with one of the plurality of solid-state devices.

6. The solid-state multi-channel protection circuit of claim 1, further including a charge pump connected to be shared by each of the plurality of solid-state devices.

7. The solid-state multi-channel protection circuit of claim 1, wherein the plurality of solid-state devices are connected in parallel with one another.

8. The solid-state multi-channel protection circuit of claim 1, further comprising:
 a switching circuit connected to each of the plurality of solid-state devices, wherein the switching circuit is configured to selectively control the On/Off state of the plurality of solid-state devices;
 wherein the microcontroller communicates with the switching circuit to selectively control the On/Off state of the plurality of solid-state switches.

9. The solid-state multi-channel protection circuit of claim 8, wherein the microcontroller controls a solid-state device to an On state when receiving a current output related to the solid-state device.

10. A method of providing multi-channel circuit protection, the method comprising:
 controlling a first multiplexer to select a temperature sensor associated with one of a plurality of solid-state devices;
 receiving at a microcontroller a temperature signal associated with the selected solid-state device;
 controlling a second multiplexer to connect a current sensor to the selected solid-state device, wherein the current sensor generates a current output with respect to the selectively connected solid-state device;
 receiving at the microcontroller a current output associated with the selected solid-state device;
 controlling a third multiplexer to connect a voltage sensor to an output of one of the plurality of solid-state devices, wherein the voltage sensor generates a voltage output with respect to the selectively connected solid-state device; and
 providing over-current, over-temperature, and under-voltage protection based on the received temperature signal, the received current output, and the received voltage output.

11. The method of claim 10, wherein the current sensor is configured to measure a voltage across the solid-state device.

12. The method of claim 11, further comprising:
 calculating a junction resistance associated with the selected solid-state device based on the received temperature signal; and
 calculating a current flowing through the selected solid-state device based on the measured voltage across the solid-state device and the junction resistance.

13. The method of claim 10, further comprising:
 controlling a switching circuit to selectively turn On the selected solid-state device prior to the current sensor generating a current output.

14. The method of claim 10, wherein the voltage sensor and the current sensor are integrated into a voltage/current sensor selectively controlled by the microcontroller to operate in a first mode to measure current and a second mode to measure voltage.

15. The method of claim 10, further including:
 communicating a detected under-voltage condition if the output voltage of the selected solid-state device is less than a threshold value.

* * * * *

UNITED STATES PATENT AND TRADEMARK OFFICE
CERTIFICATE OF CORRECTION

PATENT NO. : 12,136,913 B2
APPLICATION NO. : 17/841785
DATED : November 5, 2024
INVENTOR(S) : Nikola Stojakovic and John Caputo Page 1 of 1

It is certified that error appears in the above-identified patent and that said Letters Patent is hereby corrected as shown below:

In the Claims

Column 6, Line 39, Claim 1 "and selectively controls the first multiplexer" should read
-- "selectively controls the first multiplexer" --

Signed and Sealed this
Twenty-eighth Day of January, 2025

Coke Morgan Stewart
*Acting Director of the United States Patent and Trademark Office*